(12) United States Patent
Sawada

(10) Patent No.: US 6,184,513 B1
(45) Date of Patent: Feb. 6, 2001

(54) IMAGE SENSOR CHIP AND IMAGE SENSOR

(75) Inventor: Hideki Sawada, Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/155,072

(22) PCT Filed: Jan. 30, 1998

(86) PCT No.: PCT/JP98/00413

§ 371 Date: Sep. 21, 1998

§ 102(e) Date: Sep. 21, 1998

(87) PCT Pub. No.: WO98/34279

PCT Pub. Date: Aug. 6, 1998

(30) Foreign Application Priority Data

Jan. 30, 1997 (JP) .................................................. 9-17022

(51) Int. Cl.[7] .................... H01L 27/14; H01L 27/146; H04N 1/028

(52) U.S. Cl. ........................... 250/208.1; 250/214 A

(58) Field of Search ................... 250/208.1, 214 A, 250/214 R; 358/513, 514, 482, 483; 348/272, 281, 282, 283, 294, 300, 301, 302, 303, 304, 308

(56) References Cited

U.S. PATENT DOCUMENTS 4,084,190 * 4/1978 Stein ..................................... 348/302
4,942,473 * 7/1990 Zeevi et al. ......................... 348/281
5,724,095 * 3/1998 Shyu et al. ......................... 348/300
5,784,178 * 7/1998 Tsai et al. ........................... 358/482
5,841,554 * 11/1998 Hasegawa .......................... 358/514
5,901,257 * 5/1999 Chen et al. ......................... 382/312

FOREIGN PATENT DOCUMENTS 4-42545   2/1992   (JP) .

* cited by examiner

Primary Examiner—John R. Lee
(74) Attorney, Agent, or Firm—Merchant & Gould P.C.

(57) ABSTRACT

An image sensor chip (24) has a plurality of phototransistors (PHT) for converting light reflected by a scanned object into analog image signals, a shift register (SR) and first field effect transistors ($FET_1$) for taking the image signals sequentially out of respective output terminals of the plurality of the phototransistors (PHT), a first pad (1) for output of the image signals taken out serially by the shift register (SR) and the first field effect transistors ($FET_1$), an operational amplifier (OP) capable of amplifying the image signals from the plurality of phototransistors (PHT), a second pad (2) connected to an input terminal of the operating amplifier (OP), and a third pad (3) connected to an output terminal of the operating amplifier (OP).

6 Claims, 7 Drawing Sheets

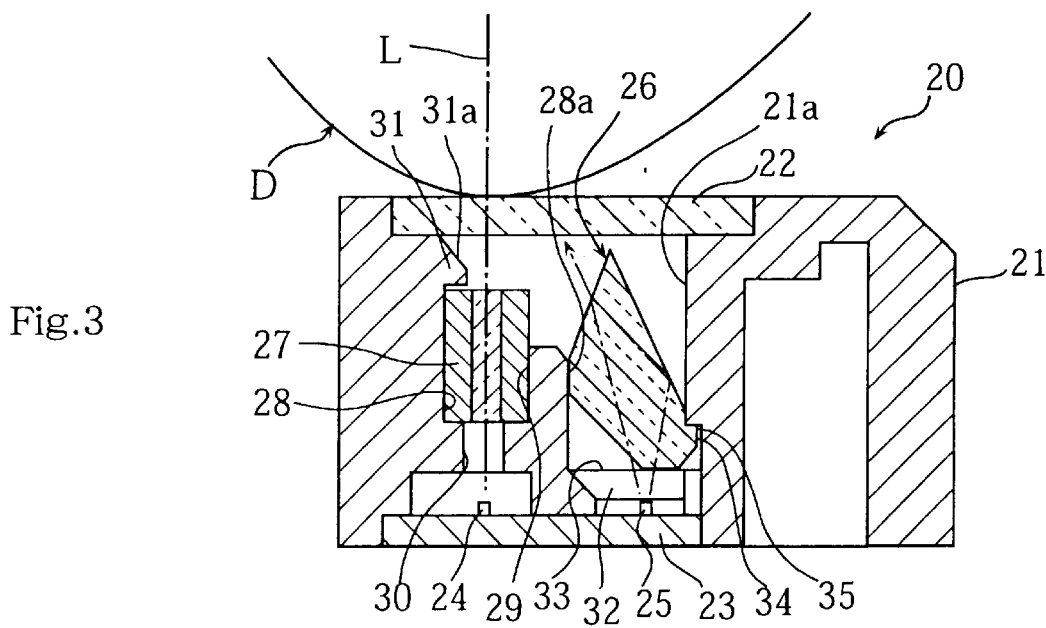
Fig.3
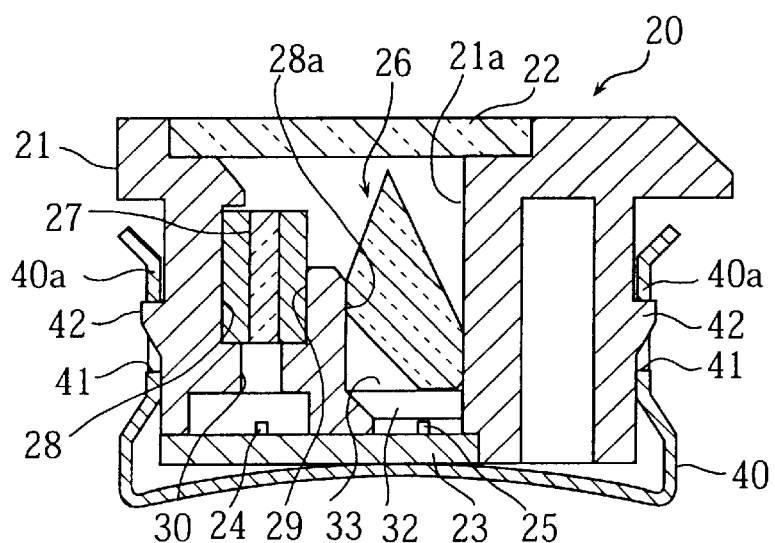
Fig.4
Fig.5

IMAGE SENSOR CHIP AND IMAGE SENSOR

TECHNICAL FIELD

The present invention relates to an image sensor chip for reading an image of a scanned object, and an image sensor comprising a plurality of the image sensor chips.

BACKGROUND ART

According to a prior art image sensor chip, image signals from a plurality of photoelectric elements are serially output from an output pad without being amplified. A prior art image sensor comprising a plurality of such image sensor chips has an amplifying circuit formed on an amplifying circuit board separate from an image sensor chip board. The image signals from each of the image sensor chips are supplied to the amplifying circuit via a wiring pattern and a connector of the image sensor chip, and a wiring pattern of the amplifying circuit. After the signals are amplified by the amplifying circuit, the signals are serially output via the wiring pattern of the amplifying circuit, a connector and other components to an external circuit.

However, according to the prior art, the image signals from each of the image sensor chips are supplied to the amplifying circuit only after passing through the wiring pattern and the connector of the image sensor chip, and the wiring pattern of the amplifying circuit. Therefore, the signals are subject to noise, and it was difficult to obtain accurate image signals of an original image. Specifically, the image signals have a small voltage whereas the amplifying circuit has a large input impedance. As a result, noise can enter easily, and may become very large if there is a long path between the image sensor chip and the amplifying circuit. Especially, if there is such an apparatus as a laser printer located near by, the image signals can be badly affected by the noise from the laser printer.

This problem may be solved for example, by encasing the image sensor in a structure made of metal such as aluminum. However, this method of electromagnetically shielding the internal circuitry of the image sensor increases manufacturing cost of the image sensor.

Another option for solution may be providing each of the image sensor chips with a built-in amplifying circuit so that each image sensor chip can output amplified image signals.

With such an arrangement, however, the amplifying circuit built in each of the image sensors will have different offset from each other, making difficult to obtain accurate image signals of an original image. This problem is particularly serious in image sensing of a colored or gradated image because the difference in offsets can easily result in difference in the gradation or color.

This problem may be solved by adding a correction circuit for correcting the differences in the offsets. The correction circuit may be added to an image signal processing circuit which processes the image signals after the signals are output from the image sensor. However, this arrangement increases manufacturing cost of the apparatus which includes the image sensor.

Another option for solution may be providing one of the image sensor chips of each row with a built-in amplifying circuit so that image signals from all of the image sensor chips of that row can be amplified by this amplifying circuit before output to an external circuit.

This arrangement can solve the problem of the difference in offset within each row. In addition, there will be less problem of noise than in the case where the amplifying circuit is made separately on the amplifying circuit board. With this arrangement, however, two types of image sensors must be manufactured for mounting on an image sensor chip board. This decreases advantages of mass production in manufacture of the image sensor chips. Further, a more complex procedure must be used for mounting the image sensor chips on the image sensor chip board, increasing manufacturing cost of the image sensor.

As exemplified above, each of the three methods has advantages and disadvantages. Preferably therefore, any of the three methods should be selectively usable depending upon application of the image sensor. However, manufacturing different types of image sensors for each method will further decrease the advantages of mass production in the manufacture of image sensor chips, increasing further the manufacturing cost of the image sensor.

DISCLOSURE OF THE INVENTION

It is therefore an object of the present invention to provide an image sensor which can selectively take an output mode of, outputting image signals without amplification, outputting image signals amplified by an amplifying circuit built for each of the image sensor, or outputting image signals amplified by an amplifying circuit provided in each row of the image sensor chips, by means of wirebonding at the time of manufacture.

Another object of the present invention is to provide an image sensor chip for such an image sensor.

According to a first aspect of the present invention, there is provided an image sensor chip comprising a plurality of photoelectric elements for converting light reflected by a scanned object into analog image signals, a selecting circuit for sequential takeout of the serial image signals from respective output terminals of the photoelectric elements, a first pad for output of the image signals taken out serially by the selecting circuit, an amplifying circuit capable of amplifying the image signals from the plurality of photoelectric elements, a second pad connected to an input terminal of the amplifying circuit, and a third pad connected to an output terminal of the amplifying circuit.

With the above arrangement, image signals before amplification can be obtained by taking image signals from the first pad. Image signals after amplification can be obtained by entering image signals from the first pad into the second pad, and then taking the image signals from the third pad. Further, other image sensor chips having the same construction may have image signals from their respective first pads entered commonly into the second pad. Then, by taking image signals from the third pad, amplified image signals from the plurality of image sensor chips can be obtained. Thus, by using a plurality of this image sensor chip, it becomes possible without increasing the manufacturing cost, to provide the image sensor which can selectively take an output mode of, outputting image signals without amplification, outputting amplified image signals, or outputting image signals amplified by another image sensor chip, by means of wirebonding at the time of manufacture.

The object to be scanned may be an image on a piece of paper or a film of resin, or the image may not necessarily be on a sheet material.

The photoelectric element may be but not limited to a photodiode or a phototransistor.

The selecting circuit may be but not limited to a shift register or a CCD.

The amplifying circuit may be but not limited to an operational amplifier.

An image sensor chip according to the preferred mode of embodiment further comprises a first switching circuit operated by external control signals for switching between a state in which the image signals from the selecting circuit are supplied to the first pad and another state in which the image signals are not supplied to the first pad, and a second switching circuit operated by external control signals for switching between a state in which output signals from the amplifying circuit are supplied to the third pad and another state in which the output signals from the amplifying circuit are not supplied to the third pad.

With the above arrangement, the first or the second switch circuit may be opened when the respective first or third pad is not used for obtaining the image signals or the amplified image signals. Thus, the transfer path of the image signals can be effectively protected from noise entering into the circuit or being output from the first or third pad. This makes possible to maintain a good reading performance, and is especially advantageous in eliminating a noise from entering the amplifying circuit and then being output from the third pad as a big noise.

Each of the first and second switching circuits may be made by but not limited to a field effect transistor.

According to a second aspect of the present invention, there is provided an image sensor comprising a wiring substrate provided with at least one row of image sensor chips described above. The wiring substrate comprises a first wiring pattern common to said at least one row of sensor chips, a second wiring pattern common to said at least one row of sensor chips, and a third wiring pattern provided individually for each of the image sensor chips in said at least one row.

According to the above arrangement, it becomes possible to manufacture an image sensor which outputs image signals without amplification, an image sensor which outputs image signals amplified by an amplifying circuit built in each of the image sensor chips, or an image sensor which outputs image signals amplified by an amplifying circuit provided in each row, from a common set of the image sensor chips and the wiring substrate board, only by changing the wirebonding pattern. Since there is no need for preparing plural types of substrate boards having different wiring patterns, the manufacturing cost can be further decreased.

According to a first wirebonding mode, the first pad of each image sensor chip is wirebonded to the first wiring pattern, so that image signals from said at least one row of the image sensor chips are output serially via the first wiring pattern.

According to a second wirebonding mode, the first and second pads of each image sensor chip are wirebonded to the corresponding third wiring pattern, whereas the third pad of each image sensor chip is wirebonded to the first wiring pattern, so that image signals from said at least one row of the image sensor chips are amplified by respective amplifying circuits for serial output via the first wiring pattern.

According to a third wirebonding mode, the wiring substrate further has a fourth wiring pattern for selected one of the sensor chips of said at least one row of the image sensor chips. The first pad of each image sensor chip is wirebonded to the second wiring pattern. The second pad of the selected image sensor chip is also wirebonded to the second wiring pattern. The third pad of the selected image sensor chip is wirebonded to the first wiring pattern. Further, the selected image sensor chip has a fourth pad which is wirebonded to the fourth wiring pattern, so that image signals from said at least one row of the image sensor chips are amplified by the amplifying circuit of the selected image sensor chip for serial output via the first wiring pattern.

Other objects, features and advantages of the present invention will become clear from detailed description hereafter to be made referring to the attached drawings.

BRIEF DESCRIPTION OF THE DRAWINGS

FIG. 3 tis a sectional view taken on lines III—III in FIG. 1.

FIG. 4 is a sectional view taken on lines IV—IV in FIG. 1.

FIG. 5 is a sectional view taken on lines V—V in FIG. 1.

BEST MODE FOR CARRYING OUT THE INVENTION

Figure 1:
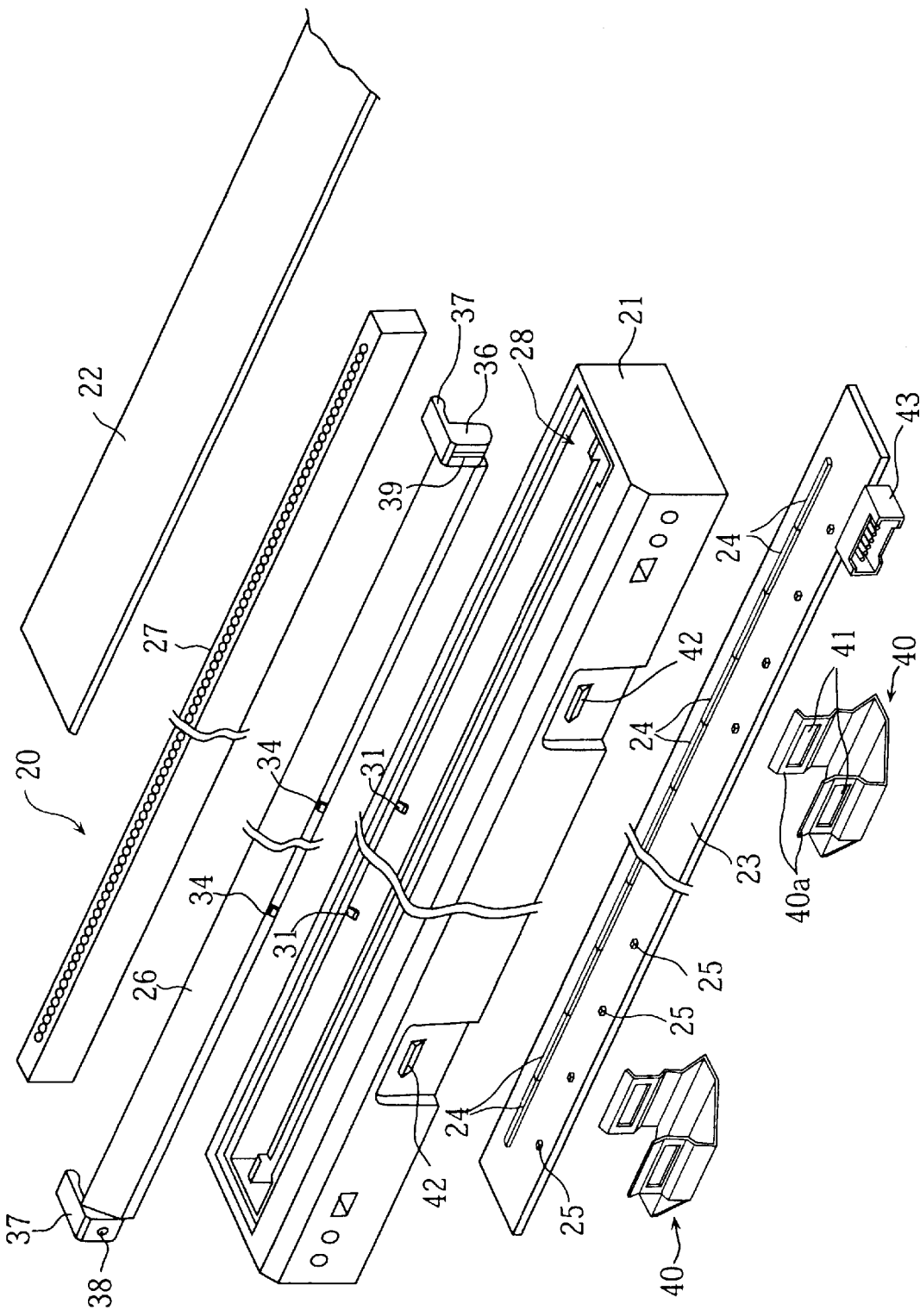
FIG. 1 is an explosive perspective view of an image sensor according of a first embodiment of the present invention.
Figure 2:
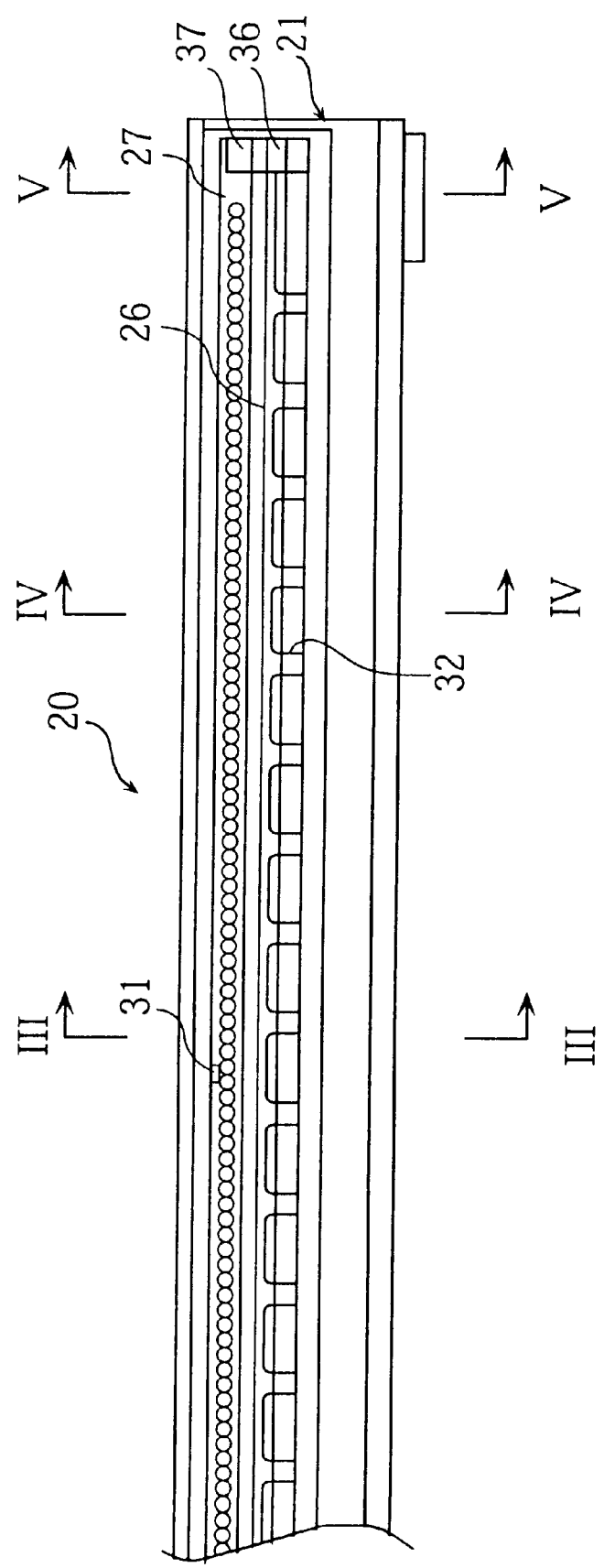
FIG. 2 is a partial plan view of the image sensor.

A preferred embodiment of the present invention is described specifically with reference to the accompanying drawings.

Referring to FIGS. 1 through 5, an image sensor 20 according to the embodiment of the present invention comprises a long case 21 having a predetermined length and a generally rectangular cross section. The case 21 can be molded of resin for example. As clearly shown in FIG. 3, the case 21 has an inner space as a perpendicular through hole, with a glass cover 22 sealing an upper opening, and a head substrate 23 sealing a bottom opening. The bottom substrate 23 has an upper surface mounted with a plurality (or specifically 18 according to the illustrated embodiment) of image sensor chips 24 along a longitudinal edge of the surface. On the same surface of the head substrate 23, and along the other longitudinal edge, a plurality of LED chips 25 are provided. The inner space of the case 21 includes a light guide 26 made of a transparent resin for directing the light from the LED chips 25 to a document D on the glass cover 22, and a rod lens array 27 for collecting light reflected by the document D on the image sensor chips 24 without magnification nor inversion.

The rod lens array 27 is inserted from above and held by a grooved holding portion 28 formed in the case 21. The grooved holding portion 28 has a holding groove 29 corresponding to the plan view shape of the rod lens array 27, and a bottom portion formed with a slit 30 for allowing the light from the rod lens array 27 to pass through to the image sensor chips 24.

As shown in FIG. 3, the grooved holding portion 28 has a long inner wall. A longitudinally intermediate portion of the inner wall is formed with a pair of projections 31 for engaging with an upper face of the rod lens array 27 so that the rod lens array 27 will not spontaneously come up. Each of the projections 31 has an appropriate height, and is formed with a tapered upper face 31a so as not to interfere with the rod lens array 27 when the rod lens array is inserted into the grooved holding portion 28.

The light guide 26 is a prism for introducing the light from the LED chips 25 efficiently to and around a reading line L. The reading line L is disposed on an optical axis of the rod lens array 27 whereas the LED chips are disposed away from the axis on the head substrates 23. The light guide 26 is fitted in a space enclosed by an inner side wall 21a of the case 21, a side wall 28a of the grooved holding portion 28, and a bottom wall 33. The bottom wall is formed with a window 32 facing the LED chips 25.

As shown in FIG. 1, the light guide 26 has a longitudinal side face with an intermediate portion formed with a couple of engaging projections 34. Further, the inner side wall 21a of the case 21 is formed with corresponding engaging recesses 35 for engaging with the projections 34. As shown in FIGS. 1 and 5, the light guide 26 has end portions each formed with a fitting block 36 of a predetermined size for fitting between the inner side wall 21a of the case and the side wall 28a of the grooved holding portion 28. Each of the fitting block 36 is formed integrally with an extending presser segment 37 for pressing a corresponding end portion of the rod lens array 27 from above. One of the fitting blocks 36 has a back face formed with a projection 38 whereas the other fitting block has a back face formed with a rib 39 for holding respective fitting blocks 36 firmly by increased friction when fitted between the inner all 21a of the case and the side wall 28a of the grooved holding portion.

The image sensor 20 of the above arrangement can be assembled in the following steps. Specifically, the rod lens array 27 is inserted from above into the grooved holding portion 28 in the case 21. In this step, each of the engaging projections 31 formed in the inner wall of the grooved holding portion 28 engages with the upper face of the rod lens array 27 so that the rod lens array 27 will not spontaneously come up.

Next, the light guide 26 is fitted from above into the space enclosed by the inner side wall 21a of the case and the side wall 28a of the grooved holding portion. In this step, each of the engaging projections 34 formed in the light guide 26 engages with the corresponding recess 35 of the case 21, and each of the fitting blocks 36 fits into the space, holding the light guide firmly into the space. Further, each of the presser segments 37 extending from the fitting block 36 of the light guide 26 presses from above the corresponding end portion of the upper face of the rod lens array 27. Thus, the rod lens array 27 is pressed at its longitudinally intermediate portions by the engaging projections 31, and at its longitudinally end portions by the presser segments 37, being held stably and firmly at the predetermined position.

The glass cover 22 is fitted by bonding for example, into the upper opening of the case 21. The head substrate 23 is fitted into the bottom opening of the case 21 and is fixed by metal clamps 40. As shown in FIG. 4, each of the clamps 40 is a generally U-shaped piece of spring steel with each of its leg portions 40a formed with an engaging hole 41 for engaging with a corresponding engaging projection 42 formed on corresponding outer side faces of the case 21.

The image sensor chips 24 (18 chips) are disposed on the head substrate in a row at a predetermined interval from each other. Each of the image sensor chips 24 has 96 photoelectric elements, and hence a total of 1728 photoelectric elements are involved in reading a line. The head substrate 23 is provided with a connector 43 for signal communications with the image sensor 20.

Figure 6:
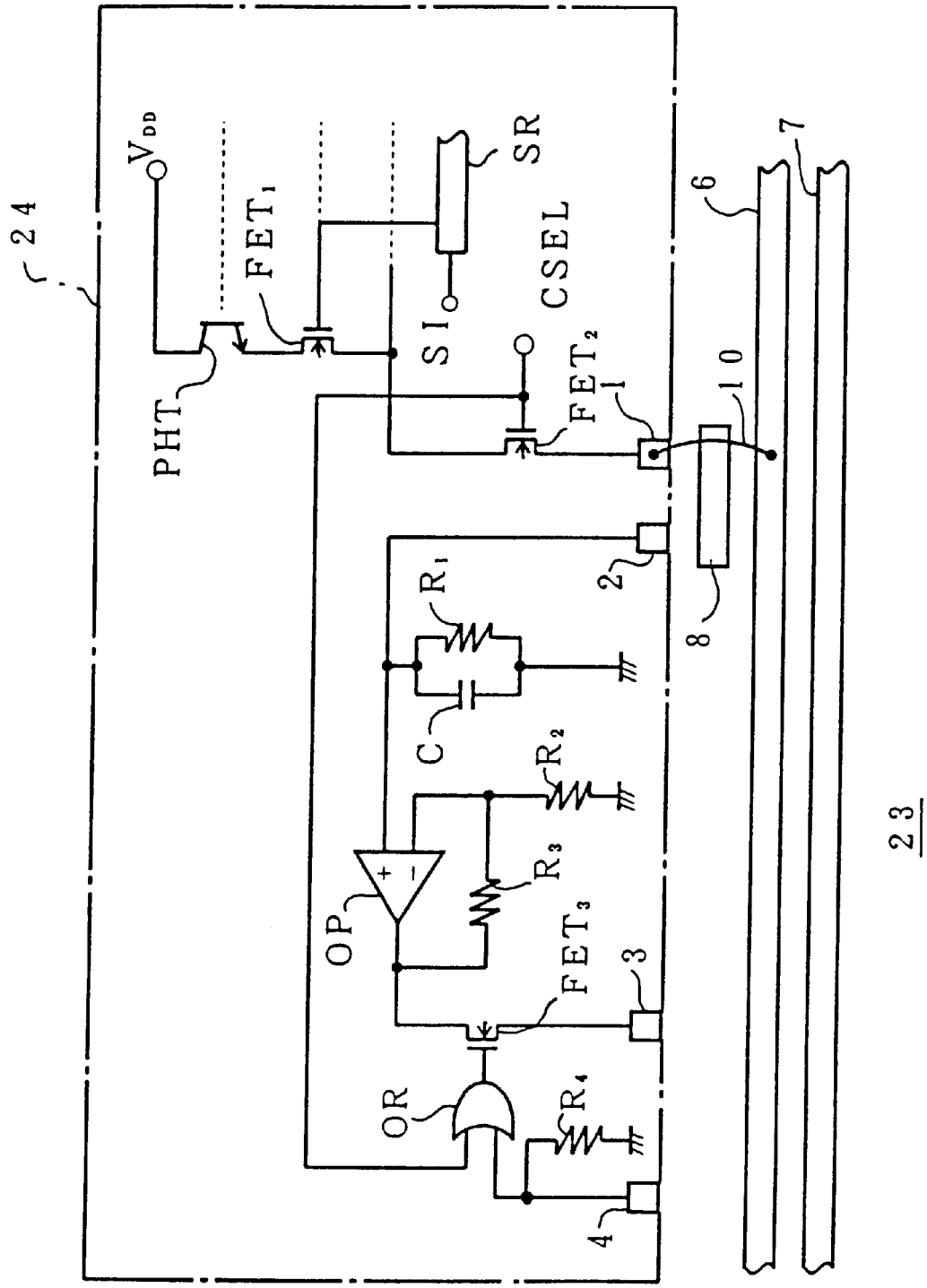
FIG. 6 is a circuit diagram showing a first example of wiring pattern for the image sensor chip.

As shown in FIG. 6, each of the image sensor chips 24 has 96 phototransistors(PHT). Each of these PHT's has its collector connected commonly to a power source VDD, whereas its emitter is connected to a drain of a corresponding first field effect transistor $FET_1$. Each of the first field effect transistors $FET_1$ has a gate connected to a corresponding bit of a shift register SR. The first field effect transistor $FET_1$ also has a source connected commonly to a drain of a second field effect transistor $FET_2$ which constitutes a first switching circuit. The shift register SR has an input terminal connected to a pad SI which receives serial-in signals. The second field effect transistor $FET_2$ has a gate connected to a pad CSEL for receiving chip-select signals supplied externally as control signals, and to one input terminal of an "or" circuit OR. The second field effect transistor $FET_2$ has a source connected to the first pad 1. The shift register SR and the first field effect transistors $FET_1$ constitute a selecting circuit for sequentially taking image signals out of respective output terminals of the plurality of phototransistors.

The first pad 1 is adjoined by a second pad 2. The second pad 2 is connected to a non-inverting input terminal of an operational amplifier OP which constitute an amplifying circuit, an end of a resistor $R_1$, and an end of a capacitor C. The other ends of resistor $R_1$ and capacitor C are grounded respectively. An inverting input terminal of the operational amplifier OP is connected to an end of a resistor $R_2$ and an end of a resistor $R_3$. The other end of the resistor $R_2$ is grounded, whereas the other end of the resistor $R_3$ is connected to an output terminal of the operational amplifier OP and a drain of the third field effect transistor $FET_3$ which constitutes a second switching circuit. The third field effect transistor $FET_3$ has a source connected to a third pad 3. The third field effect transistor $FET_3$ also has a gate connected to an output terminal of the "or" circuit OR. The other input terminal of the "or" circuit OR is connected to an end of the resistor R4, with the other end of the resistor R4 being grounded.

The head substrate 23 has an upper surface formed with a first wiring pattern 6 which is a common wiring pattern wired to a connector 43 disposed on the head substrate 23 adjacent to the image sensor chips 24, a second wiring pattern 7 which is a common wiring pattern formed adjacent to the first wiring pattern 6; and a third wiring pattern 8 which is made of a plurality of individual wiring patterns formed adjacent to the first and second pads 1, 2.

The first through fourth pads 1,2,3,4 are selectively wire-bonded to the first through third wiring patterns 6, 7 or 8. By changing the pattern of wirebonding, the mode of image signal output from the image sensor 20 can be changed.

For example, as shown in FIG. 6, the first pad 1 of each of the image sensor chips 24 may be connected to the first wiring pattern 6 via a wire 10. In this case, image signals from the phototransistors PHT go through their respective first field effect transistors $FET_1$, the second field effect transistor $FET_2$, first pad 1, wire 10, first wiring pattern 6, and connector 43 before being out put from the image sensor 20. In other words, the image signals are output from the image sensor 20 without being amplified by the operational amplifier OP.

Circuit operation for serial output of image signals will be described here only briefly since this is public information: One of the image sensor chips 24 is selected by a chip-select signal. The chip-select signal turns on the second field effect transistor $FET_2$ of the selected image sensor chip 24, making the first pad 1 ready to receive image signals. Then, a serial-in signal is entered to the shift resistor SR. The serial-in signal is shifted in synchronization with a clock signal. This sequentially turns on the first field effect transistors $FET_1$ connected to respective bits at each stage of the shift register SR so that image signals are output in series. Such a cycle of operation is sequentially made for each of the image sensor chips 24 so the total of 1728 image signals from one line can be output in series.

Figure 7:
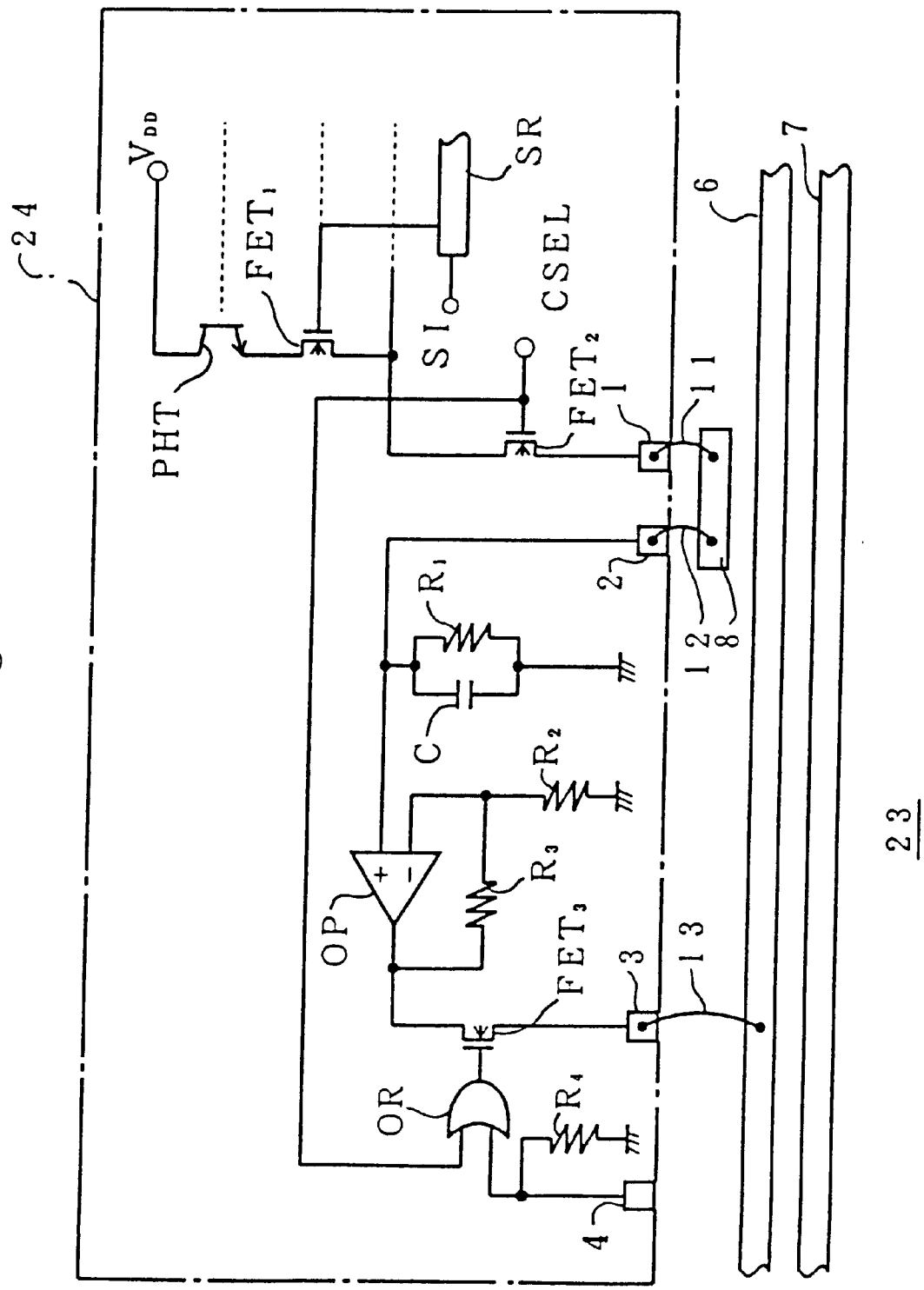
FIG. 7 is a circuit diagram showing a second example of wiring pattern for the image sensor chip.

As shown in FIG. 7, each of the image sensor chips 24 may be wirebonded so its first pad 1 is connected to the third wiring pattern 8 via a wire 11, whereas its second pad 2 is connected to the third wiring pattern 8 via a wire 12, and its third pad 3 is connected to the first wiring pattern 6 via a wire 13. In this case, image signals from the phototransistors PHT go through their respective first field effect transistor $FET_1$, the second field effect transistor $FET_2$, first pad 1, wire 11, third wiring pattern 8, wire 12, and second pad 2 before entering into the non-inverting input terminal of the operational amplifier OP. Then, the image signals are amplified by the operational amplifier OP, and goes through the third field effect transistor $FET_3$, third pad 3, wire 13, first wiring pattern 6 and connector 43 before being output from the image sensor 20. In other words, the image signals after being amplified by the operational amplifier OP mounted in each of the image sensor chips 24 are output from the image sensor 20.

Figure 8:
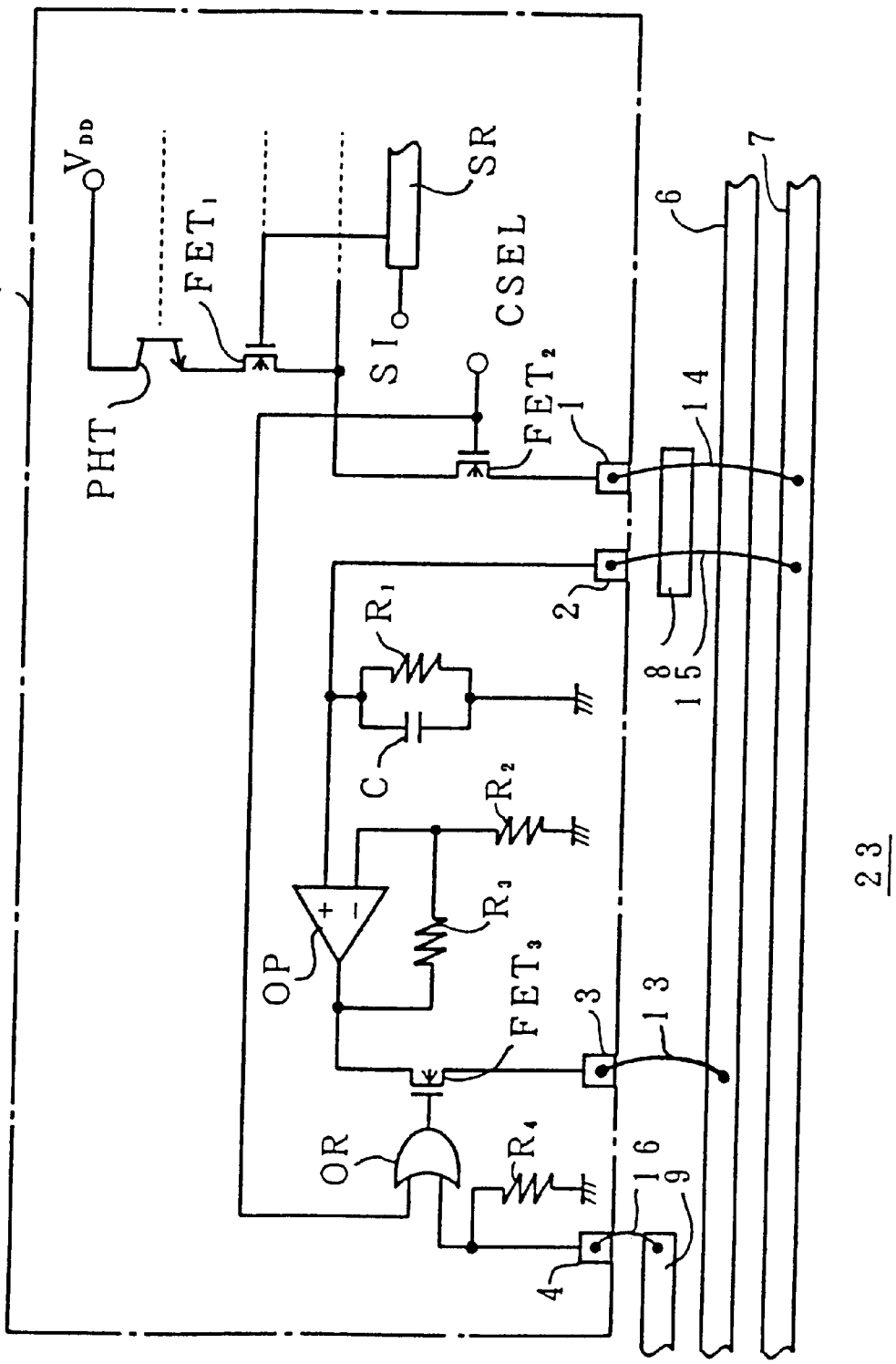
FIGS. 8 and 9 respectively show a circuit diagram showing a third example of wiring pattern for the image sensor chip.
Figure 9:
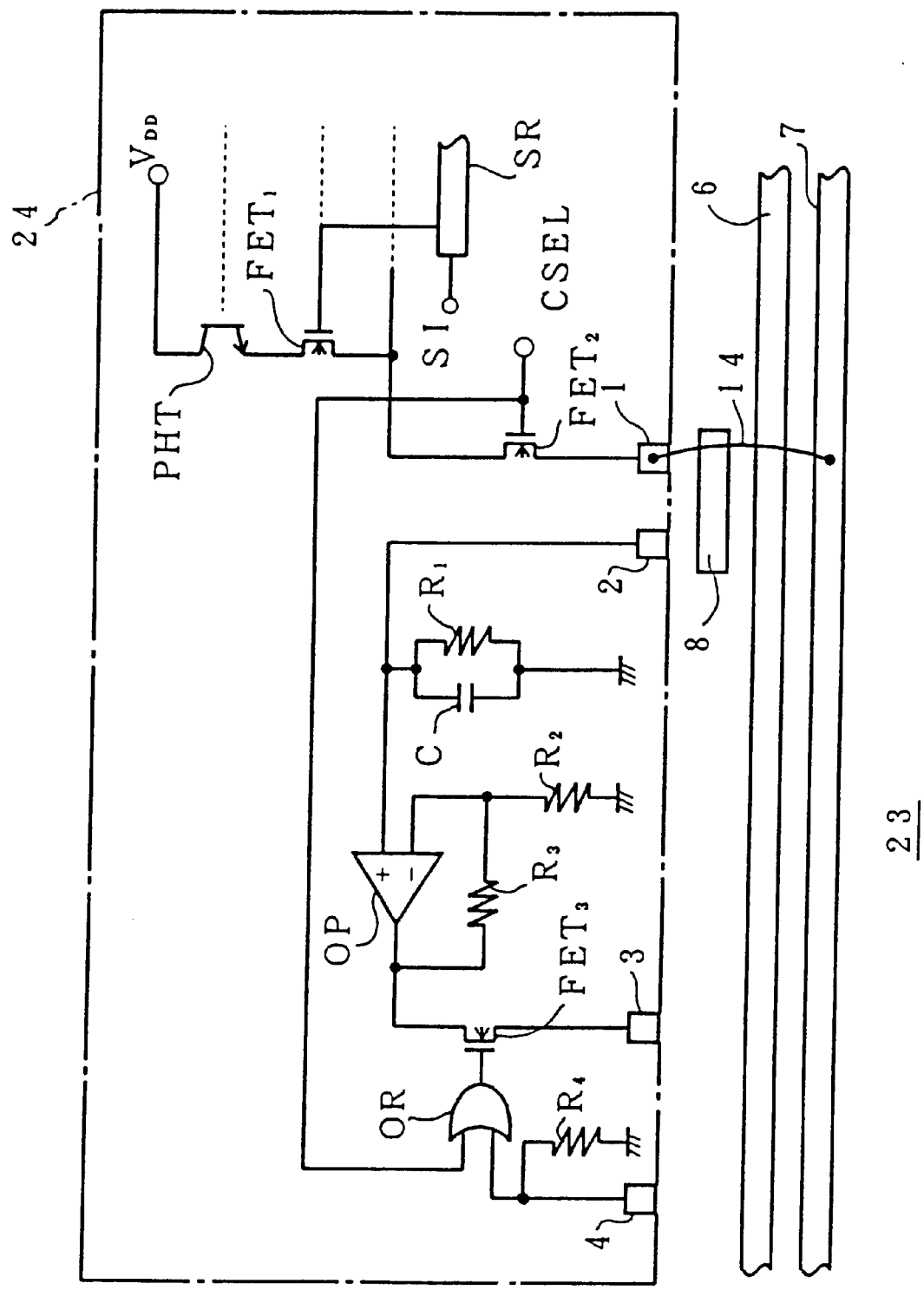

Further, an arrangement may be made as shown in FIG. 8, for a left-end image sensor chip 24 for example, of the total of 18 image sensor chips 24. A fourth wiring pattern 9 is formed adjacent to the fourth pad 4. Of this particular image sensor chip, the first pad 1 is connected to the second wiring pattern 7 via a wire 14, the second pad 2 is connected to the second wiring pattern 7 via a wire 15, and the fourth pad 4 is connected to the fourth wiring pattern 9 via a wire 16. For the rest of the image sensor chips 24, as shown in FIG. 9, each of the first pad 1 is connected to the second wiring pattern 7 via the wire 14. In this case, image signals from the phototransistors PHT of said rest of the image sensor chips 24 go through their respective first field effect transistor $FET_1$, the second field effect transistor $FET_2$, first pad 1, wire 11, and wire 14 before entering into the second wiring pattern 7. Then, these image signals go through the wire 15 into the second pad 2, are amplified by the operational amplifier OP, and then go through the third field effect transistor $FET_3$, third pad 3, wire 13, first wiring pattern 6 and connector 43 before being output from the image sensor 20. Meanwhile, in the left-end image sensor chip 24, the "or" circuit OR has its other input terminal supplied with power VDD via the fourth wiring pattern 9, wire 16, and the fourth pad 4. As a result, the third field effect transistor $FET_3$ stays turned on even when there is no chip-select signal supplied to the relevant input terminal. In other words, the image signals from each of the image sensor chips 24 are amplified by the operational amplifier OP mounted in the left-end image sensor chips 24, and then output from the image sensor 20. It should be noted that the fourth wiring pattern 9 is only formed adjacent to the fourth pad 4 of the left-end image sensor chip 24.

According to the embodiment described above, the image sensor chips 24 are disposed in a single row on the head substrate 23. Alternatively however, the image sensor chips 24 may be disposed in a plurality of rows on the head substrate 23 with each row provided with the wiring patterns 6 through 8 formed near by. This arrangement provides a plane-image sensor. With this arrangement, the first wiring pattern 6 of each row may be individually wired to the connector 43 for parallel output of the image signals from each of the image sensor chips 24. Alternatively, the first wiring pattern 6 of each row may be combined into a single wiring pattern, and then wired to the connector 43 so that the image signals from all of the image sensor chips 24 are output serially from the image sensor.

What is claimed is:

1. An image sensor chip comprising:
   a plurality of photoelectric elements for converting light reflected by a scanned object into analog image signals;
   a selecting circuit for sequential takeout of the serial image signals from respective output terminals of the photoelectric elements;
   a first pad for output of the image signals taken out serially by the selecting circuit;
   an amplifying circuit capable of amplifying the image signals from the plurality of photoelectric elements;
   a second pad connected to an input terminal of the amplifying circuit, and
   a third pad connected to an output terminal of the amplifying circuit.

2. The image sensor chip according to claim 1, further comprising a first switching circuit operated by external control signals for switching between a state in which the image signals from the selecting circuit are supplied to the first pad and another state in which the image signals are not supplied to the first pad, and a second switching circuit operated by external control signals for switching between a state in which output signals from the amplifying circuit are supplied to the third pad and another state in which the output signals from the amplifying circuit are not supplied to the third pad.

3. An image sensor comprising a wiring substrate provided with at least one row of image sensor chips according to claim 1, wherein the wiring substrate comprises a first wiring pattern common to said at least one row of sensor chips, a second wiring pattern common to said at least one row of sensor chips, and a third wiring pattern provided individually for each of the image sensors in said at least one row.

4. The image sensor according to claim 3, wherein the first pad of each image sensor chip is wirebonded to the first wiring pattern for serial output of the image signals from said at least one row of the image sensor chips via the first wiring pattern.

5. The image sensor according to claim 3, wherein the first and second pads of each image sensor chip are wirebonded to a corresponding third wiring pattern, whereas the third pad of each image sensor chip is wirebonded to the first wiring pattern for amplification of the image signals from said at least one row of the image sensor chips by respective amplifying circuits before serial output via the first wiring pattern.

6. The image sensor according to claim 3, wherein the wiring substrate is further provided with a fourth wiring pattern for selected one of the sensor chips in said at least one row, the first pad of each image sensor chip being wirebonded to the second wiring pattern, the second pad of the selected image sensor chip being also wirebonded to the second wiring pattern, the third pad of the selected image sensor chip being wirebonded to the first wiring pattern, the selected image sensor chip having a fourth pad wirebonded to the fourth wiring pattern for amplification of the image signals from said at least one row of image sensor chips by the amplifying circuit of the selected image sensor chip before serial output via the first wiring pattern.

* * * * *